(12) United States Patent
Vijayaraghavan et al.

(10) Patent No.: US 11,180,367 B2
(45) Date of Patent: Nov. 23, 2021

(54) THIN FILM MATERIAL TRANSFER METHOD

(71) Applicant: THE UNIVERSITY OF MANCHESTER, Manchester (GB)

(72) Inventors: Aravind Vijayaraghavan, Salford (GB); Christian Berger, Manchester (GB)

(73) Assignee: THE UNIVERSITY OF MANCHESTER, Manchester (GB)

( * ) Notice: Subject to any disclaimer, the term of this patent is extended or adjusted under 35 U.S.C. 154(b) by 60 days.

(21) Appl. No.: 16/498,596

(22) PCT Filed: Mar. 21, 2018

(86) PCT No.: PCT/GB2018/050733
§ 371 (c)(1),
(2) Date: Sep. 27, 2019

(87) PCT Pub. No.: WO2018/178634
PCT Pub. Date: Oct. 4, 2018

(65) Prior Publication Data
US 2020/0048082 A1 Feb. 13, 2020

(30) Foreign Application Priority Data
Mar. 28, 2017 (GB) .................................. 1704950

(51) Int. Cl.
*B81C 1/00* (2006.01)
*B81B 3/00* (2006.01)
*G01L 9/00* (2006.01)

(52) U.S. Cl.
CPC ........ *B81C 1/00666* (2013.01); *B81B 3/0013* (2013.01); *B81B 3/0072* (2013.01);
(Continued)

(58) Field of Classification Search
CPC ............ B81C 1/00666; B81C 1/00952; B81C 2201/0194; B81C 2201/017;
(Continued)

(56) References Cited

U.S. PATENT DOCUMENTS 3,940,016 A * 2/1976 Krakauer ................ G07F 11/42
221/129
2013/0215551 A1* 8/2013 Bowers .................. H05K 1/032
361/301.1
(Continued)

FOREIGN PATENT DOCUMENTS

WO 2017/077331 5/2017

OTHER PUBLICATIONS

Papageorgiou et al. ("Mechanical properties of graphene and graphene-based nanocomposites," Progress in Materials Science, 90, pp. 75-127, 2017) (Year: 2017).*
(Continued)

*Primary Examiner* — Yasser A Abdelaziez
(74) *Attorney, Agent, or Firm* — Greenblum & Bernstein, P.L.C.

(57) ABSTRACT

A method of transferring a two-dimensional material such as graphene onto a target substrate for use in the fabrication of micro- and nano-electromechanical systems (MEMS and NEMS). The method includes providing the two-dimensional material in a first lower state of strain; and applying the two-dimensional material onto the target substrate whilst the two-dimensional material is under a second higher state of strain. A device comprising a strained two-dimensional material suspended over a cavity.

13 Claims, 5 Drawing Sheets a.i a.ii a.iii b.i b.ii b.iii (52) U.S. Cl.
CPC .. *B81C 1/00952* (2013.01); *B81B 2201/0264* (2013.01); *B81B 2203/0127* (2013.01); *B81C 2201/0194* (2013.01); *G01L 9/0073* (2013.01)

(58) Field of Classification Search
CPC ................ B81B 3/0013; B81B 3/0072; B81B 2203/0127; G01L 9/0073
See application file for complete search history.

(56) References Cited

U.S. PATENT DOCUMENTS

2013/0334579 A1\* 12/2013 Accardi ............... G01N 27/414
257/253
2017/0030009 A1\* 2/2017 Kim ......................... D01F 1/10

OTHER PUBLICATIONS

Bao et al. ("Controlled ripple texturing of suspended graphene and ultrathin graphite membranes," Nature Nanotechnology, vol. 4, pp. 562-566, Sep. 2009) (Year: 2009).\*
International Search Report issued in International Patent Application No. PCT/GB2018/050733, dated Jun. 6, 2018.
International Preliminary Report on Patentability for International Patent Application No. PCT/GB2018/050733, dated Oct. 1, 2019, and Written Opinion of the International Searching Authority.
Search Report in UK Patent Application No. GB1704950.3, dated Aug. 10, 2017.
Suk et al., "Transfer of CVD-Grown Monolayer Graphene onto Arbitrary Substrates," ACS Nano 5(9):6916-6924 (2011).
Young et al., "Strain Mapping in a Graphene Monolayer Nanocomposite," ACS Nano 5(4):3079-3084 (2011).

\* cited by examiner

THIN FILM MATERIAL TRANSFER METHOD

FIELD

The present invention relates to a method of applying a two-dimensional material onto a target substrate, a method of fabricating a device and a device comprising a two-dimensional material suspended over a cavity. In particular the invention relates to the application of a two-dimensional material onto a target substrate whilst subjecting the two-dimensional material to a tensile stressing force.

BACKGROUND

Certain micro- and nano-electromechanical systems (MEMS and NEMS), for example capacitive pressure sensors, accelerometers and RF switches, typically comprise a thin conductive membrane, such as a two-dimensional material, which is suspended above a fixed counter-electrode in parallel plate geometry. In this configuration, for example in a capacitive pressure sensor, a higher sensitivity is achieved by increasing the suspended membrane area, reducing the dielectric gap and using a membrane material with a lower bulk elastic modulus. However, this increases the size of the sensor, resulting in nonlinear pressure transduction and limited dynamic operating range. Since the dielectric that separates the suspended membrane from the counter electrode is typically air or vacuum, the fabrication of large area membranes with a small dielectric gap often results in membrane collapse driven by capillary forces and stiction issues due to electrostatics during fabrication or device testing.

A key step in the manufacture of such MEMS and NEMS may be the transfer of a two-dimensional material from an originator substrate to a target substrate (the fixed counter-electrode).

SUMMARY OF THE INVENTION

The inventors have recognised that known methods of applying a two-dimensional material to a target substrate in the manufacture of MEMS and NEMS, for example a capacitive pressure sensor, may suffer from issues due to nanoscale cracks and membrane stiction which results from the fabrication process and the atomic thickness of the two-dimensional material, for example graphene.

One strategy for preventing nanoscale cracks in graphene is to reinforce a graphene membrane with another material. For example, by stacking up multiple layers of CVD graphene on top of one another, crack-free freestanding structures up to 1.5 mm in diameter and 5.1 nm thickness are obtainable. However, this approach requires many fabrication steps, is very time consuming and results in wrinkling of the suspended membranes.

It is one aim of the present invention, amongst others, to provide a method of applying a two-dimensional material onto a target substrate that addresses at least one disadvantage of the prior art, whether identified here or elsewhere, or to provide an alternative to existing methods. For instance it may be an aim of the present invention to provide a method of applying a two-dimensional material onto a target substrate which provides an improved device due to the two-dimensional material having fewer surface defects than devices produced by methods of the prior art.

According to aspects of the present invention, there is provided methods and a device as set forth in the appended claims. Other features of the invention will be apparent from the dependent claims, and the description which follows.

According to a first aspect of the present invention, there is provided a method of applying a two-dimensional material onto a target substrate, the method comprising the steps of:

a) providing the two-dimensional material in a first state of strain; and b) applying the two-dimensional material onto the target substrate whilst subjecting the two-dimensional material to a tensile stressing force which produces a second state of strain in the two-dimensional material;

wherein the strain of the two-dimensional material in the second state of strain is higher than the strain of the two-dimensional material in the first state of strain.

Suitably the steps of the method of this first aspect are carried out in the order step a) followed by step b).

Throughout this specification the term "two-dimensional material" refers to a material selected from the group of materials including: one or more single layers of homo-atoms or hetero-atoms arranged in layers with strong bonds within a layer and weaker bonds in between layers of the material; or a single layer of homo-atoms or hetero-atoms that is either free-standing or supported on another material wherein the atoms are arranged in a planar structure which has one dimension significantly smaller than its other two dimensions; or a crystalline material wherein unit cells are repeated in two spatial dimensions but not in the third dimension; or a material having a thickness of less than five nanometres. The two-dimensional material may comprise any one or more of the following: graphene, hexagonal boron nitride, phosphorene, transition metal dichalcogenides, transition metal oxides, layered clay materials, graphene oxide, fluorographene, germanene, graphane, graphyne, borophene, silicone, and stanene.

The two-dimensional material may be alternatively defined as a membrane, suitably a conductive membrane.

Suitably the two-dimensional material comprises graphene.

Suitably the two-dimensional material is graphene.

Graphene is typically grown on a copper surface by the chemical vapour deposition (CVD) technique. The surface of the copper has non-planar surface features which can be incorporated into grapheme grown on the surface. Further non-planar features or compression may be introduced into the graphene during a cooling step after formation of the graphene. When grapheme is transferred off the copper on to another surface, for example a silicon oxide surface of a silicon wafer, the resulting graphene has a number of ripples and compressive stress regions which can negatively impact the performance of a device in which the graphene is ultimately incorporated. This is a particularly severe problem when the device comprises cavities over which the graphene is suspended, for example capacitive pressure sensors.

Furthermore, inhomogeneous stress in two-dimensional materials such as graphene weaken the suspended structure, reduce their deflection sensitivity and result in irreproducible and inhomogeneous large scale fabrication of devices incorporating said two-dimensional materials.

Known transfer techniques to form such devices with suspended two-dimensional materials which may strain the two-dimensional material, such as those methods incorporating a thermal treatment step, are difficult to accurately control and may expose the device to undesirable temperature.

The inventors have found that the method of this first aspect can provide a reproducible and reliable amount of strain in the two-dimensional material on the target substrate, which may be particularly important in the large scale production of micro- and nano-electromechanical systems (MEMS and NEMS), such as capacitive pressure sensors.

Furthermore, the method of this first aspect allows the amount and direction of the strain in the two-dimensional material on the target substrate to be tuneable according to a specific desired value, for example for a specific application.

Furthermore, the strain in the two-dimensional material on the target substrate can stiffen the two-dimensional material and in doing so reduce stiction problems which are caused by Casmir forces and electrostatics in known methods and devices.

Strain

The tensile stressing force applied to the two-dimensional material during step b) may be applied along a single axis of the two-dimensional material. In some embodiments, the tensile stressing force applied to the two-dimensional material during step b) may be applied along more than one axis of the two-dimensional material simultaneously. For example, the tensile stressing force applied to the two-dimensional material during step b) may be applied along two axes of the two-dimensional material simultaneously, suitably two substantially perpendicular axes. In some embodiments, the tensile stressing force applied to the two-dimensional material during step b) may be applied along more than two axes of the two-dimensional material simultaneously.

In some embodiments, the tensile stressing force applied to the two-dimensional material during step b) may be applied radially, i.e. from above or below the plane of the two-dimensional material, suitably from above the plane of the two-dimensional material with respect to the target substrate. For example, the two-dimensional material may be subjected to a pressure during step b) from a gas or a liquid or through the use of an electrostatic force. Said radially applied stressing force may deform the two-dimensional material so that it adopts a curvature in the second state of strain.

Suitably after step b), the two-dimensional material is adhered to the target substrate, suitably through van der Waals forces.

Suitably the two-dimensional material is applied onto the target substrate during step b) by a transfer device.

Suitably the tensile stressing force applied to the two-dimensional material during step b) is actively applied, for example by the operation of a stressing device.

The stressing device may be part of a transfer device adapted to apply the two-dimensional material onto the target substrate whilst subjecting the two-dimensional material to the tensile stressing force.

Suitably step b) is carried out using a transfer device adapted to simultaneously apply the two-dimensional material onto the target substrate and subject the two-dimensional material to the tensile stressing force.

Step a) involves providing the two-dimensional material in a first state of strain. Strain can be measured as the ratio of an extension in length of the material in question to an original length of the material, expressed as a percentage. For example:

strain %=(extension in length/original length)×100

The strain in the two-dimensional material may be measured by Raman spectroscopy using standard techniques. For example, a Raman spectrum of the two-dimensional material may be taken. In a graphene two-dimensional material, this provides two spectra peaks called the G and 2D peaks. Both peaks shift to lower values of wavenumber when strain is applied. The applied strain is directly proportional to the shift, and this constant of proportionality is known as the Grüneisen parameters. Using these values, the strain in the two-dimensional material can be calculated from the peak shift.

Suitably the first state of strain is a strain of below 0.2%. The first state of strain may be defined in comparison to a state where the two-dimensional material is in a neutral state wherein the two-dimensional material is neither strained nor compressed. The first state of strain may be a strain of between 0 and 0.2%. Suitably the strain is as measured by Raman spectroscopy, for example as described in Young et al, Strain Mapping in a Graphene Monolayer Nanocomposite, ACS Nano, 2011, vol. 5, pages 3079-3084.

In some embodiments, the first state of strain may be a compressed state.

The two-dimensional material in the first state of strain may comprise wrinkles and other surface defects.

Suitably, the two-dimensional material in the first state of strain is not subjected to a tensile stressing force, for example from an external device or a transfer/support layer, such as a stressor layer. The two-dimensional material in the first state of strain may comprise some areas of residual strain, despite being substantially unstained.

Suitably the two-dimensional material in the first state of strain is substantially unstrained, suitably unstrained.

Step b) involves subjecting the two-dimensional material to a tensile stressing force which produces a second state of strain in the two-dimensional material. Suitably the second state of strain is a strain of from 0.05 to 1.5%, suitably a strain of from 0.1 to 0.4%. Suitably as measured by Raman spectroscopy, as discussed above.

The strain of the two-dimensional material in the second state of strain is higher than the strain of the two-dimensional material in the first state of strain. By this we mean that in the second state of strain the two-dimensional material is under a larger tensile stressing force in at least one direction than the two-dimensional material in the first state of strain and/or that the two-dimensional material is extended in at least one direction in the second state of strain compared to the first state of strain.

Suitably the second state of strain is at least partially maintained in the two-dimensional material on the target substrate after step b) has been carried out. Suitably the strain of the two-dimensional material on the substrate after step b) is from 0.05 to 1.5%, suitably a strain of from 0.1 to 0.4%. Suitably as measured by Raman spectroscopy, as discussed above.

In embodiments wherein the tensile stressing force applied to the two-dimensional material during step b) is applied along more than one axis of the two-dimensional material simultaneously, the above limitations in relation to strain may apply to at least one or more of these axes, suitably, to each axis.

Step a) may involve removing the two-dimensional material from an originator substrate. The originator substrate may be the substrate on which the two-dimensional material was formed, for example a copper foil on which a graphene two-dimensional material has been formed.

The Support Layer

Suitably the two-dimensional material is laminated to a support layer. Therefore, the two-dimensional material may be provided as part of a laminated membrane. Suitably the support layer is a flexible material, suitably a single layer of flexible material.

Therefore this first aspect may provide a method of applying a two-dimensional material onto a target substrate, wherein the two-dimensional material is laminated to a support layer, the method comprising the steps of:
a) providing the two-dimensional material and the support layer in a first state of strain; and
b) applying the two-dimensional material and the support layer onto the target substrate whilst subjecting the two-dimensional material and the support layer to a tensile stressing force which produces a second state of strain in the two-dimensional material and the support layer;
wherein the strain of the two-dimensional material and the support layer in the second state of strain is higher than the strain of the two-dimensional material and the support layer in the first state of strain.

Suitably this first aspect provides a method of applying a two-dimensional material onto a target substrate, wherein the two-dimensional material is laminated to a support layer, the method comprising the steps of:
a) providing the two-dimensional material and the support layer in a first state of strain; and
b) applying the two-dimensional material and the support layer onto the target substrate whilst subjecting the two-dimensional material and the support layer to a tensile stressing force which produces a second state of strain in the two-dimensional material and the support layer;
wherein the second state of strain is a strain of from 0.05 to 1.5%;
wherein the strain of the two-dimensional material and the support layer in the second state of strain is higher than the strain of the two-dimensional material and the support layer in the first state of strain.

The inventors have found that providing the two-dimensional material laminated to a support layer compensates for the fragile nature of two-dimensional materials (related to their atomic thickness). This fragility limits their resilience to mechanical manipulation and their structural stability in a freestanding or suspended state. For example, a monolayer of CVD graphene when suspended across a cavity of 20 microns diameter typically has a 20-40% survival rate after fabrication. The support layer suitably forms a bond to the two-dimensional material across its entire surface and thereby acts as reinforcement, allowing larger areas of the two-dimensional material to be suspended than would otherwise be possible. Suitably the support layer is a thin/soft material which allows the two-dimensional material to maintain its properties in a device.

The inventors have also found that tuning the thickness of the support layer can modify the effective elastic modulus and bending stiffness of a suspended two-dimensional material. This is useful for the method of this first aspect because a micromanipulator device for providing the strain to the two-dimensional material may require the two-dimensional material to have a specific stiffness in order to accurately apply strain. Such tuning of the thickness of the support layer may also enable specific performance requirements, for example a specific resonant frequency or a specific membrane deflection sensitivity, to be achieved in a device produced using the method of this first aspect.

The inventors have also found that the support layer may allow control over the adhesive properties of the two-dimensional material and the target substrate onto which it is applied. The adhesion of two-dimensional materials to their target substrates is dominated by short-range Van-der-Waals forces. As two-dimensional materials have a negligible bending stiffness they typically conform to any surface very well. The adhesion of two-dimensional materials to their target substrates is therefore typically very strong and this can be a disadvantage in building suspended MEMS devices. For example, if adhesion is too strong, the two-dimensional material may stick to the substrate in an uncontrolled manner before its intended release position. If the adhesion is too weak then this will prevent the two-dimensional material from completely adhering to the target substrate in a strained configuration and allow the two-dimensional material to slip back to an unstrained configuration upon release. Using a support layer may allow a desired adhesion strength of the two-dimensional material to the target substrate to be achieved.

With regards to a device comprising a two-dimensional material spanning a cavity having a vertical side-wall, the suspended two-dimensional material may adhere to the side-wall of the cavity causing an inconsistent stressing of the two-dimensional material, depending on which part of the side-wall of the cavity has the most side-wall adhesion. This defect may be prevented by using a support layer as described above.

The inventors have also found that the support layer may allow control over the gas-permeability across the two-dimensional material. Mono and bilayers of two-dimensional material typically form an impermeable membrane when suspended across a cavity. By laminating a support layer onto the two-dimensional material the bending stiffness and hence the adhesion of the membrane to the underlying substrate is reduced. Although the membrane continues to be impermeable to gases through the plane of the membranes, this reduction in adhesion allows gas to leak into and out of the cavity via the interface between the substrate and the laminate of the two-dimensional material and the support layer. Gas permeability may be beneficial in some devices comprising two-dimensional materials suspended over a cavity. Such gas permeability is useful in high frequency MEMS devices operating under static pressure. For example, a hydrophone (underwater microphone) is designed to have a specific resonance frequency. If it is then submerged 1 km underwater then 1 MPa of static pressure acts on the membrane and thereby shifts its resonance frequency. However, if the membrane allows gas/liquid to permeate across it, this pressure can be equilibrated and the original resonant frequency can be restored.

Suitably the support layer is a dielectric material. Suitably the support layer is a dielectric material comprising a polymer or a ceramic substance. The dielectric material may be selected from any one or more of: silicon oxide, silicon, silicon nitride, an epoxy-based photoresist, an electron-beam resist, quartz, sapphire, glass, plastic, fibre-glass, hafnium oxide, aluminium oxide, boron nitride and doped silicon.

The support layer may be polymeric dielectric material selected from any one or more of: parylene, polymethymethacrylate, polydimethylsiloxane, silicones, pressure sensitive adhesive film (PSAF), thermal release tape (TRT), SU-8, Cellulose Nitrate (NC), Cellulose Acetate Butyrate (CAB), polyurethane (PU), polyimide (PI), liquid crystal polymer (LCP), carbon nano-membrane (CNM), diamond like carbon (DLC), porous 2d materials, gold nanoparticle membranes (GNM).

The support layer may be dielectric material selected from any one or more of: aluminium oxide ($Al_2O_3$ or AlOx), hafnium oxide (HfOx). These are brittle in bulk but can act as very effective flexible dielectric materials, and therefore as effective support layers in the present invention, when made extremely thin (5-20 nm thick).

The support layer may be another two-dimensional material or a layered/laminated two-dimensional material film. For example, in some embodiments the support layer may be a stack of 10-20 graphene oxide flakes, which may be assembled by vacuum filtration.

Suitably the support layer is a flexible dielectric material.

The two-dimensional material may be a continuous layer or may comprise discontinuous sections or discontinuous sections of different two-dimensional materials.

In embodiments wherein the two-dimensional material is provided as part of a laminated membrane, the laminated membrane may comprise at least two layers of the two-dimensional material sandwiching at least one layer of the support layer. Alternatively the laminated membrane may comprise at least two layers of the support layer sandwiching at least one layer of the two-dimensional material. Alternatively the laminated membrane may comprise one layer of the two-dimensional material deposited directly on top of one layer of the two-dimensional material.

In step a) the two-dimensional material may be laminated to a support layer and then removed from an originator substrate.

The support layer may be a sacrificial layer. Therefore the support layer may be removed from the two-dimensional material after step b).

The Transfer Substrate

Step a) may involve adhering the two-dimensional material to a transfer substrate. The transfer substrate may be a tape which is adhered to the two-dimensional and/or and support layer present on the two-dimensional material. Suitably the transfer substrate is a tape adhered to a support layer (which is laminated to the two-dimensional material).

Suitably at least a part of the two-dimensional material is freely suspended between a first part and a second part of the transfer substrate.

Suitably the two-dimensional material and any support layer present is adhered to the transfer substrate on at least four parts of the two-dimensional material. Suitably on at least two pairs of opposing sides of the two-dimensional material.

The transfer substrate, for example a tape, may form a frame which surrounds the two-dimensional material, the two-dimensional material and any support layer present being freely suspended inside the frame.

The transfer substrate may be a donor wafer, for example a silicon wafer, and the two-dimensional material and any support layer present may be adhered to the donor wafer on at least a first part of the two-dimensional material.

The Target Substrate

The target substrate may comprise a cavity and step b) may involve at least partially suspending the two-dimensional material over the cavity.

Suitably the target substrate is a capacitive plate, for example for use in a capacitive pressure sensor. Suitably the two-dimensional material and any support layer present is a conductive membrane (electrode), for example for use in a capacitive pressure sensor.

Suitably the cavity is an open topped cavity formed in the target substrate. Suitably the target substrate comprises a plurality of cavities formed in an array. Suitably step b) involves applying the two-dimensional material to the target substrate so that the two-dimensional material spans each cavity and completely covers each cavity. Suitably the two-dimensional material forms an air tight seal for each cavity.

In some embodiments, a ratio of a surface area of the two-dimensional material spanning each cavity is between 0.5 to twenty times that of a surface area of the two-dimensional material abutting or contacting the target substrate.

In other embodiments the ratio of a surface area of the two-dimensional material spanning each cavity is between five to ten times that of a surface area of the two-dimensional material abutting or contacting the target substrate.

The structure of suitable capacitive pressure sensors is described in PCT/GB2016/053457.

The target substrate may be a component of a micro-electro-mechanical or nano-electro-mechanical system (MEMS/NEMS).

In some embodiments, the target substrate may be a component of a substrate supported device, for example selected from: field effect transistors and interconnects for use in microprocessor circuits, chemical and gas sensors, photodetectors, photovoltaic devices and displays.

In some embodiments, the target substrate may be a component of a suspended device, for example selected from: accelerometers, pressure sensors, displays and microfluidics.

Methods of Applying the Two-Dimensional Material

In some embodiments of the method of this first aspect, step b) involves adhering at least a first part of the two-dimensional material to the target substrate and applying the tensile stressing force to a second part of the two-dimensional material to provide the second state of strain in the two-dimensional material between the first and second parts of the two-dimensional material.

Suitably in said embodiments, the two-dimensional material and any support layer present is adhered to a transfer substrate on at least the second part of the two-dimensional material to which the tensile stressing force is applied.

The tensile stressing force may be applied by manipulating the transfer substrate. Suitably the tensile stressing force is applied by a micromanipulator device. For example, a micro-manipulator device or a donor wafer may comprise at least one pair of clamps fixed to opposite ends of the two-dimensional material. At least one of the clamps may be moveable relative to the other clamp in order to apply the tensile stressing force to the two-dimensional material. The motion of the moveable clamp can be controlled with micron resolution using one or a combination of the following components: a precision screw threading, a piezoelectric stack, an induction coil (magnetic), an electrostatic micromanipulator or a linear piezoelectric drive.

In said embodiments, step b) suitably involves progressively applying the two-dimensional material to the target substrate between the first and second parts of the two-dimensional material.

In said embodiments, the transfer substrate may be a frame and the two-dimensional material and any support layer present is adhered to the frame so that the frame surrounds the two-dimensional material on all sides. Suitably the two-dimensional material is then partially detached from the frame to leave only the second part of the two-dimensional material mounted on the frame. The first part of the two-dimensional material is then adhered to the target substrate, the tensile stressing force is applied to the second part of the two-dimensional material and the two-dimensional material is progressively applied to the target substrate between the first and second parts of the two-dimensional material.

In embodiments wherein the two-dimensional material and any support layer present is freely suspended between a first part and a second part of a transfer substrate, step b) may involve subjecting the two-dimensional material to the tensile stressing force between the first and second parts of the transfer substrate and applying the two-dimensional material onto the target substrate by lowering the two-dimensional material onto the target substrate, for example in a stamping procedure.

In said embodiments, the two-dimensional material and any support layer present is suitably adhered to a transfer substrate on at least four parts of the two-dimensional material. Suitably the two-dimensional material and any support layer present is adhered to a transfer substrate on at least two pairs of opposing sides of the two-dimensional material and the tensile stressing force is applied between each of the at least two pairs of opposing sides of the two-dimensional material. For example, a micro-manipulator device or a donor wafer may comprise at least two pairs of clamps fixed to opposite ends of the two-dimensional material, each of the at least two pairs of clamps arranged perpendicular to the other. At least one of the clamps in each pair of clamps may be moveable relative to the other clamp in order to apply the tensile stressing force to the two-dimensional material, as described above.

In some embodiments, step b) involves applying the two-dimensional material from a roll onto the target substrate.

Applying the two-dimensional material from a roll onto the target substrate may involve using a roller or series of rollers which impart the tensile stressing force on the two-dimensional material. For example, the tensile stressing force may be applied to the two-dimensional material using a series of segmented outward-facing rollers; using heating elements to expand the two-dimensional material during application from a roller; or by using a series of curved rollers.

In such embodiments, the method may involve the following steps:
A) moving the two-dimensional material across a cylindrical roller providing the two-dimensional material in the first state of strain;
B) subjecting the two-dimensional material to a tensile stressing force via a (set of) roller(s) which produces the second state of strain in the two-dimensional material;
C) moving the two-dimensional material in the second state of strain across a cylindrical roller which transfers the two-dimensional material in the second state of strain onto the target substrate.

Suitably a biaxial tensile stress is applied in the plane at the two-dimensional material during steps B) and C), suitably with one axis of strain aligned in the direction of the roller motion and one axis of strain perpendicular to the roller motion.

Strain in the direction of the roller motion may be achieved by applying a controlled difference in relative roller speed between the roller in step A) and the roller(s) in step B), thereby increasing the winding tension between the rollers.

Strain in the perpendicular direction to the roller motion may be achieved by passing the two-dimensional material over one or a series of rollers in one or more of the following configurations:

1. Uniaxial strain via segmented rollers: The rollers in step B) may be segmented and orientated in at a slight angle relative to the direction of motion of the roller in step A), with the angle progressively increasing from a central roller segment towards an outer most roller segment. As the two-dimensional material is passed over the outward-facing segmented rollers, strain is created in the perpendicular direction of the roller motion.
2. Uniaxial stress via convex rollers: The rollers in step B) may have a convex shape. As the two-dimensional material is passed over convex rollers a strain is created in the perpendicular direction of the roller motion.

According to a second aspect of the present invention, there is provided a method of fabricating a device, the method comprising:
(i) providing a target substrate having at least one cavity, and
(ii) applying a two-dimensional material on to the target substrate according to a method of the first aspect.

The device, target substrate and two-dimensional material of this second aspect may have any of the features and advantages described in relation to the first aspect.

Suitably the target substrate is a capacitive plate, for example for use in a capacitive pressure sensor. Suitably the two-dimensional material and any support layer present is a conductive membrane (electrode), for example for use in a capacitive pressure sensor.

Suitably the cavity is an open topped cavity formed in the target substrate. Suitably the target substrate comprises a plurality of cavities formed in an array. Suitably step b) involves applying the two-dimensional material to the target substrate so that the two-dimensional material spans each cavity and completely covers each cavity. Suitably the two-dimensional material forms an air tight seal for each cavity.

In some embodiments a ratio of a surface area of the two-dimensional material spanning each cavity is between 0.5 to twenty times that of a surface area of the two-dimensional material abutting or contacting the target substrate.

In other embodiments the ratio of a surface area of the two-dimensional material spanning each cavity is between five to ten times that of a surface area of the two-dimensional material abutting or contacting the target substrate.

The structure of suitable capacitive pressure sensors is described in PCT/GB2016/053457.

The device may be a micro-electro-mechanical or nano-electro-mechanical system (MEMS/NEMS).

In some embodiments, the device may be a substrate supported device, for example selected from: field effect transistors and interconnects for use in microprocessor circuits, chemical and gas sensors, photodetectors, photovoltaic devices and displays.

In some embodiments, the device may be a suspended device, for example selected from: accelerometers, pressure sensors, displays and microfluidics.

According to a third aspect of the present invention, there is provided a device comprising:
a substrate having at least one cavity; and
a two-dimensional material mounted on the substrate;
wherein the two-dimensional material spans at least a part of the cavity; and
wherein the two-dimensional material has a strain of from 0.05 to 1.5%.

The device, target substrate and two-dimensional material of this third aspect may have any of the features and advantages described in relation to the first and second aspects.

According to a further aspect of the present invention there is provided a transfer device adapted to transfer a two-dimensional material onto a target substrate, suitably according to a method of the first aspect.

The transfer device may have any of the suitable features and advantages as described in relation to the first aspect.

BRIEF DESCRIPTION OF THE DRAWINGS

For a better understanding of the invention, and to show how example embodiments may be carried into effect, reference will now be made to the accompanying drawings in which.

EXAMPLES

Fabrication of Suspended Graphene and Graphene-Polymer Heterostructure Membranes Fabrication of a capacitive pressure sensor begins with a graphene flattening process. A copper foil of 5 mm×5 mm size with CVD-graphene on its top surface is coated with a thin poly(methyl methacrylate) (PMMA) layer by spin-coating and baking at 130° C. for 5 minutes. The foil is then floated in a 2.5 wt/vol % aqueous ammonium persulfate solution for 4 hours in order to etch away the copper. The remaining graphene-PMMA membrane is then transferred into a deionised (DI) water bath by fishing it with a microscope slide. This process is repeated for two further DI water baths in 15 minute intervals to allow contaminants to be cleaned from the graphene surface. After the third DI water bath, the film is transferred onto a plasma cleaned $Si/SiO_2$ substrate using the same fishing method. As the water dries from this substrate the graphene-PMMA membrane conforms to the surface of the $SiO_2$. On baking the dried substrate at 130° C. for 15 minutes the PMMA re-flows allowing the graphene to further flatten onto the $Si/SiO_2$ substrate surface.

The second step in the sensor fabrication is to release the graphene-PMMA membrane from the $Si/SiO_2$ substrate. Although the graphene is now relatively flat, the PMMA layer is inhomogeneous and has built-in strain because it was initially formed on an undulating copper foil whose surface morphology does not match that of the flat $SiO_2$ surface. Therefore, the $Si/SiO_2$ substrate comprising the flattened graphene is first submerged in acetone followed by hexane in order to remove the PMMA layer used in the initial transfer process. Once dried, a new PMMA layer (PMMA 950 3 wt % in anisole) is spin-coated (3000 rpm for 60 s) and baked (130° C. for 5 mins) onto the graphene.

A tape support window or frame (transfer substrate) that has an opening slightly larger than the target sensor area (target substrate), for example a rectangular area, is then adhered to the graphene-PMMA membrane. The graphene-PMMA membrane with tape support window is then submerged in an aqueous potassium hydroxide solution (30 wt %) for up to 5 hours until the tape support window and graphene-PMMA membrane lifts off the $Si/SiO_2$ substrate and floats on the surface of the solution.

Similarly to step 1, the tape supported membrane is cleaned in three subsequent DI water baths before it is removed from the final bath with tweezers using the tape as a handle.

The next step is to form the target substrate comprising cavities and electrodes. On a separate $Si/SiO_2$ substrate, a positive photoresist mask (Shipley 31813) is exposed using an optical lithography system (Microtech LaserWriter). The $Si/SiO_2$ target substrate is then developed (Shipley MF319) and patterned by deep reactive ion etching using $CHF_3$ and Ar gas (Oxford Plasma Lab 100) to form an array of circular or hexagonal holes of a given diameter, periodicity and depth, arranged in various patterns such as a hexagonally packed lattice. The remaining photoresist is then removed with acetone and another positive photomask is formed using a double layer resist (Shipley PMGI and 31813) to define electrode structures. A thermal evaporator (Moorfield Nanotechnology) is then used to deposit 5 nm chromium followed by 70 nm gold followed by removal of the double layer photoresist using developer (MF319) and acetone.

In the final step, the tape supported graphene-PMMA membrane is aligned with the target substrate using an in-house built transfer system (Suit, J. W. et al. Transfer of CVD-Grown Monolayer Graphene onto Arbitrary Substrates, ACS Nano, 5, 6916-6924 (2011)). The graphene-PMMA membrane is then brought into contact with the target substrate and the edges of the film are torn using a sharp tipped tool, releasing the tape window support. This provides Comparative Device 1 formed using an unstrained transfer method.

In order to provide Example Device 1, the following procedure for the final transfer step was used. The tape supported graphene-PMMA membrane prepared as described above was lowered onto the target substrate at a slight angle such that the membrane adhered to the target substrate near to one edge of the freely suspended rectangular membrane defined by the tape window as described above. The two sides perpendicular to the adhered side are then gently torn using a sharp tool. The tape support window was then subjected to a tensile stressing force by pulling in the opposite direction (away from) the part adhered to the target substrate. This induces a uniaxial tensile strain in the graphene-PMMA membrane. The edge of the membrane attached to the tape support window is then lowered onto the target substrate, progressively adhering the graphene to the substrate whilst maintaining the tensile strain in the graphene. When the membrane is completely adhered to the substrate, the edge attached to the tape support window is cut. The PMMA polymer may then be subsequently removed to retain the graphene on the substrate.

A high sensitivity polymer-supported CVD graphene device (Example Device 1) was fabricated with the strain transfer method described above. The Example Device 1 contains micro-wells that are etched into the base of the cavities in order to reduce the contact area below the suspended membrane, thereby reducing the likelihood of the suspended membrane sticking to the cavity surface. In addition, the shape of cavities is hexagonal in order achieve high packing densities whilst preventing high local stresses as found in square shaped membranes. Testing procedures and results to assess the performance of this device are given below.

EXAMPLES

Characterisation of Suspended Graphene-Polymer Membrane Arrays

Identifying the number of inactive membranes, that have either collapsed or contain cracks, is important for modelling the pressure sensor performance. In order to optimise the fabrication procedure, a series of optical and mechanical techniques were used in parallel to identify the failure mechanism of collapsed membranes. Sensors were first imaged by optical microscopy (OM) to check for rips, cracks or contaminants in the graphene-polymer film. Samples with full coverage and homogenous film transfer were then analysed by Raman spectroscopy and atomic force microscopy (AFM).

Renishaw Streamline™ Raman mapping allows mapping of the signiture G (1580 $cm^{-1}$) and 2D (2680 $cm^{-1}$) peak intensities over the entire sample area. The G peak intensity gave the highest contrast between suspended and substrate-supported regions due to laser interference effects from the variation in effective refractive index through air in comparison to $SiO_2$. Care must be taken when identifying suspended membranes since contaminants can show an enhanced Raman signal that is easily mistaken for a suspended membrane. Further characterisations of successfully transferred films was undertaken by AFM Quantitative Nanomechanical Mapping (QNM). This mode of AFM allows the production of high resolution maps of the height (AFM-height) and effective elastic modulus (AFM-modulus) of devices under test. The combination of height and modulus data allows a determination of whether the membranes are truly suspended and highlights any cracks or tears in the membranes that may not be visible from optical microscopy and Raman mapping.

EXAMPLES

Raman Spectroscopy of Strained Graphene-Polymer Films

Figure 1:
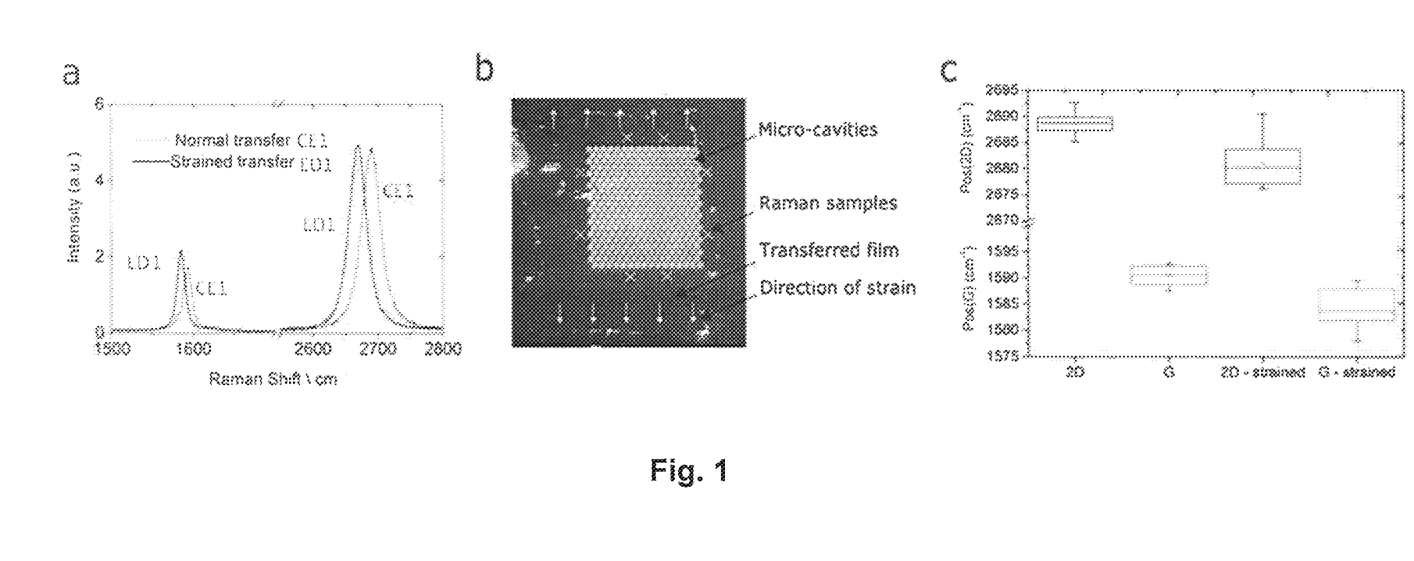
FIG. 1 depicts the characterisation of a strained transfer method of the first aspect of the present invention, wherein (a) shows a Raman spectrum of an arbitrary reference point on a supported section of two individual graphene-polymer films transferred using the unstrained and strained transfer techniques; (b) is a photograph of a device of the third aspect of the present invention indicating the direction of strain and 8 sample points at which Raman spectra were taken (scale bar 100 µm); (c) is a chart indicating the spread of peak positions of the signature 2D and G peak of graphene in graphene-polymer films transferred by unstrained and strained methods.

The Raman spectra of Comparative Device 1 (unstrained transfer) and Example Device 1 (strained transfer) were compared (FIG. 1a) in order to estimate the applied strain on the graphene. In total, eight sample points spread around the perimeter of the cavity array were probed on each of the two samples as shown in FIG. 1b. Each sample point was taken on flat portions of the substrate in order to eliminate measurement artefacts due to topographical undulations. The position of the 2D and G peak of each of the probed points on of the unstrained and strained samples are shown in FIG. 1c. The mean value of the peak positions in the relative samples show a significant down shift in the signature 2D and C peak at 1585 $cm^{-1}$ and 2685 $cm^{-1}$ respectively. This indicates that the graphene membrane in Example Device 1 is strained by 0.15±0.05%.

EXAMPLES

Effects of Strained Transfer

The challenge in achieving high sensitivity over a small area in a capacitive pressure sensor, whilst maintaining a large pressure range, is to minimise the air gap between the sensing membrane and the cavity bed. In order to maximise the sensitivity of the capacitive pressure sensors the membranes were positioned as close as possible to the cavity bed.

Figure 2:
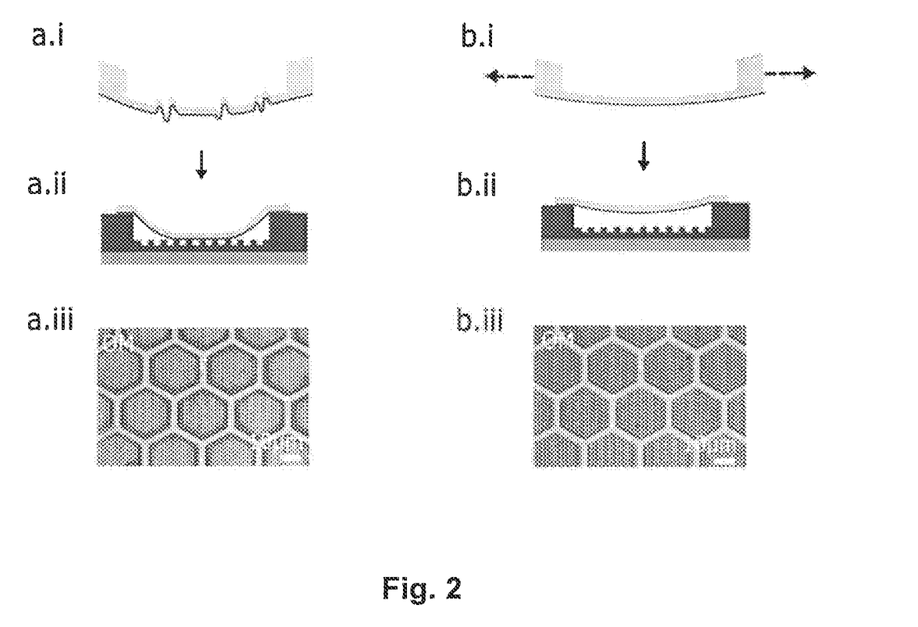
FIG. 2 shows: (i-ii) schematics comparing unstrained membrane transfer (a) to strained membrane transfer (b); (iii) optical micrographs taken at 50× magnification of the resultant samples when the unstrained and strained transfer methods are applied.

FIG. 2 shows a schematic of the device resulting from the strained transfer method of the present invention and an optical micrograph of the resulting suspended membrane structure in comparison to a known unstrained membrane transfer method. The schematic illustrates that crumpled graphene-polymer membranes as transferred using the known method (a.1) results in excess material that can readily adhere the to the cavity (a.ii). When these membranes are strained, such crumples are flattened out (b.i) and the membrane can span large areas without stiction to the cavity (b.ii). The optical micrographs (a.iii and b.iii) show a change in contrast between collapsed and suspended membranes respectively due to applying strain during membrane transfer. The applied strain during transfer is estimated as 0.15±0.01 by Raman spectroscopy as discussed above.

Topography

The surface of the membranes after the strained transfer method of the present invention can be analysed by measuring the wrinkles/defects in the surface—x, y, z measurements—compared to those of a wrinkled film, with respect to any underlying substrate (if present). Such measurements can be performed by atomic force microscopy (AFM).

Figure 3:
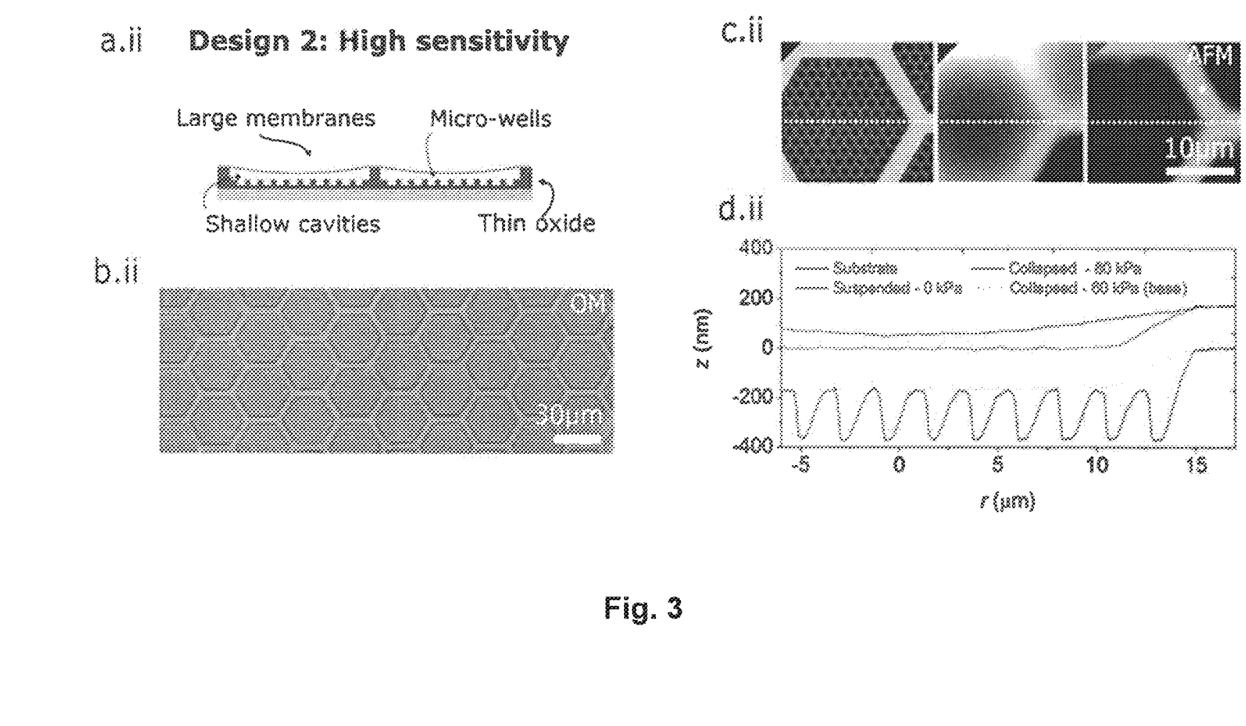
FIG. 3 shows a schematic optical micrograph and an atomic force micrograph (AFM) of a device prepared according to the first aspect of the present invention.

A schematic optical micrograph and AFM of this optimised design (design 2 Example Device 1) is shown in FIG. 3 a-d.ii.

FIG. 3 a.ii) shows a device schematic of two cells of an optimised pressure sensing array (Design 2=Example Device 1). FIG. 3 b.ii) shows an optical micrograph of an array of pressure sensing cells as transferred by the strained transfer process (Example Device 1). FIG. 3 c.ii and d.ii) show AFM height maps of a bare substrate, suspended graphene-polymer membrane (top line, d.ii) and collapsed graphene-polymer membrane respectively (second line from top, d.ii), with the associated cross-section profile along the white dotted line. The collapsed profile in d.ii is identical to that of a membrane transferred without strain.

Graphene-polymer membranes as transferred using the conventional (unstrained) method results in excess material that can readily adhere to the cavity. However, when these membranes are strained, the membrane can span large areas without stiction to the cavity and remain freely suspended. The optical micrographs shown in FIG. 3 b.ii shows an array of suspended membranes after a strained transfer onto a cavity baring substrate of Example Device 1.

The morphology of a bare micro-cavity, a suspended graphene-polymer membrane and a collapsed membrane are shown in FIG. 3 d.ii. Taking the film thickness as 140±4 nm, we estimate that the graphene layer is suspended just 40±4 nm above the oxide layer. Further comparison of the collapsed membrane with a cross-section of the bare micro-cavity reveals negligible adhesion to the sidewalls of the sub-cavities. This suggests that the membrane is loosely bound to the bed of the micro-cavity, relying solely on the adhesion to the area remaining on the cavity bed.

Performance of Example Device 1

Figure 4:
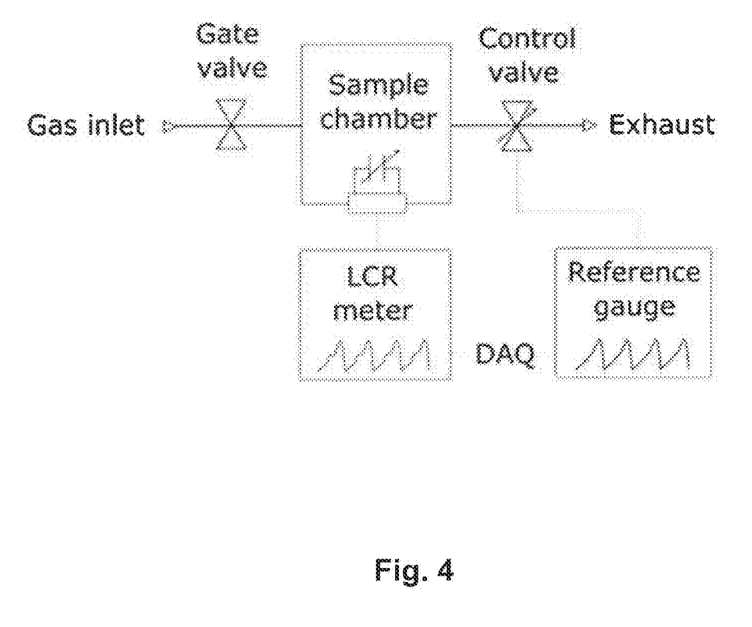
FIG. 4 depicts a schematic of the measurement setup used to measure the capacitive pressure sensors.

Example Device 1 which is optimised for high sensitivity was tested in a pressure setup as shown in FIG. 4. The device performance was characterised using the following measurement protocol. First devices were evacuated using a scroll pump, followed by a $N_2$ gas purge, giving a stable and inert atmosphere inside the pressure chamber. In order to calibrate the drift of the capacitance, samples were measured for 1 hour at equilibrium pressure in an $N_2$ atmosphere. During this period we observed a drift of 0.05% of the total capacitance. The pressure was then varied between atmospheric pressure (0 kPa pressure difference between inside and outside of the cavity) and 80 kPa at various speeds and time intervals in order to characterise the sensor response. As the pressure inside the chamber increases the suspended graphene-polymer membranes are pressed into the micro-cavities with a force proportional to the chamber pressure. The capacitance between the graphene layer and the doped silicon substrate is measured using a high precision LCR meter with a resolution of 1 fF in typical operating conditions. Capacitance measurements were taken at 1 kHz with a bias of 1 V, giving a noise limited capacitance accuracy of 0.05%.

Figure 5:
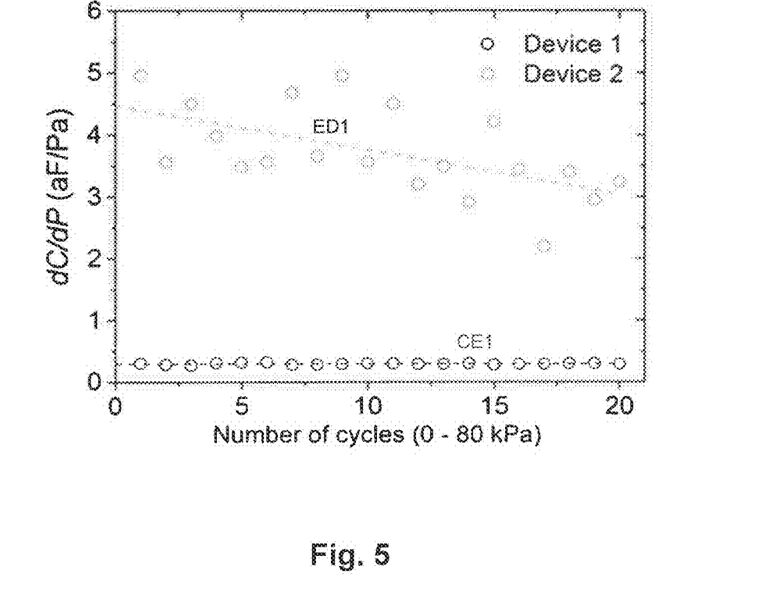
FIG. 5 shows a comparison of the capacitance-pressure sensitivity of Comparative Example 1 (CE1-design 1) and Example Device 1 (ED1-design 2) according to the third aspect of the present invention.

FIG. 5 shows the sensitivity of a device with design 2 (Example Device 1-ED1) when cycled between 0 and 80 kPa at 30 second intervals compared with design 1 (Comparative Example 1-CE1). However, cycling the sensor does not give the same degree of reproducibility in sensitivity as the first generation device. The large variance in the device's response is attributed to noise in the capacitance measurements which is likely due to charge leakage through the oxide and along the chip surface. The inventors expect the majority contribution to originate from trapped states and mobile surface charge in the gate oxide as a result of the DRIE of sub-cavities. In order to reduce the noise level in future iterations a pinhole free dielectric or deposition of a barrier layer may be used.

EXAMPLES

Discussion

Example Device 1 demonstrates an improved electromechanical coupling of the graphene-polymer membrane and therefore improved device sensitivity. Moreover, the large pressure range (800 kPa) is maintained as the membrane diameter is kept considerably smaller and the membrane is pre-strained during the transfer procedure. The stiffness of the membranes used in these devices lies between that of silicon and polymer based MEMS (10.9 GPa) and the membrane transfer technique enables the fabrication of densely packed suspended membranes on the wafer scale. However, the elastic properties of the membrane can be varied with ease by modifying either the polymer thickness or number of graphene layers. For example, by using an even stiffer membrane in a similar architecture as shown by Example Device 1 could further extend the pressure range of graphene-polymer pressure sensors whilst maintaining a high sensitivity.

In addition to improving device sensitivity and range, the graphene-polymer membrane structure aims to overcome several reliability issues faced in current MEMS and NEMS technologies. First, the use of sacrificial layers in CMOS (complementary metal-oxide semiconductor) processing puts several limitations on device architecture and material design; materials must be resistant to aggressive etchants, have sufficient stability to overcome capillary forces, and an additional sealing step is required after removal of the sacrificial etchant. By transferring the active mechanical component directly onto a pre-patterned micro-cavity in air we avoid trapping liquids that initiate membrane collapse and completely seal the micro-cavity. Moreover, CMOS compatible polymers such as Parylene-C have been shown to be equally valid for this fabrication process. A further challenge is presented by the brittle fatigue in silicon-based membranes. This failure mechanism is often attributed to stress corrosion cracking, whereby stress-assisted hydrolysis of the native or deposited $SiO_2$ layer initiates crack propagation. Graphene and PMMA are both known to have reversible morphological changes in response to humidity and there is no indication of crack formation or propagation on cycling the pressure sensors.

EXAMPLES

Conclusion

The present invention provides the fabrication and characterisation protocol of graphene-polymer capacitive pressure sensor arrays. Using this method, a capacitive pressure sensor with an improved sensitivity was produced whilst maintaining a relatively large working pressure range. By applying strain to the membrane during transfer, membranes 30 microns across were suspended less than 50 nm above the surface of micro-cavities etched into silicon dioxide. This precision enables excellent electromechanical coupling giving an unprecedented pressure sensitivity of 123 aF/Pa*$mm^2$ over a pressure scale of 80 kPa. This improved transfer process may provide further improvements in other MEMS and NEMS devices having a wide variety of applications, for example from micron-scale pumps and valves in microfluidics and lab-on-chip devices to pressure sensors and actuators in biomedical applications.

In summary the present invention provides a method of transferring a two-dimensional material such as graphene onto a target substrate for use in the fabrication of micro and nano-electromechanical systems (MEMS and NEMS). The method comprises providing the two-dimensional material in a first lower state of strain and applying the two-dimensional material onto the target substrate whilst the two-dimensional material is under a second higher state of strain. A device comprising a strained two-dimensional material suspended over a cavity is also provided.

Although a few preferred embodiments have been shown and described, it will be appreciated by those skilled in the art that various changes and modifications might be made without departing from the scope of the invention, as defined in the appended claims.

Throughout this specification, the term "comprising" or "comprises" means including the component(s) specified but not to the exclusion of the presence of other components. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, when referring to compositions, a composition consisting essentially of a set of components will comprise less than 5% by weight, typically less than 3% by weight, more typically less than 1% by weight of non-specified components.

The term "consisting of" or "consists of" means including the components specified but excluding addition of other components.

Whenever appropriate, depending upon the context, the use of the term "comprises" or "comprising" may also be taken to encompass or include the meaning "consists essentially of" or "consisting essentially of", and may also be taken to include the meaning "consists of" or "consisting of".

The optional features set out herein may be used either individually or in combination with each other where appropriate and particularly in the combinations as set out in the accompanying claims. The optional features for each aspect or exemplary embodiment of the invention as set out herein are also to be read as applicable to any other aspect or exemplary embodiments of the invention, where appropriate. In other words, the skilled person reading this specification should consider the optional features for each exemplary embodiment of the invention as interchangeable and combinable between different exemplary embodiments.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, and drawings), and/or all of the steps of any method or process so disclosed, may be combined in any combination, except combinations where at least some of such features and/or steps are mutually exclusive.

Each feature disclosed in this specification (including any accompanying claims, and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, and drawings), or to any novel one, or any novel combination, of the steps of any method or process so disclosed.

The invention claimed is:

1. A method of applying a two-dimensional material onto a target substrate, wherein the two-dimensional material is laminated to a support layer, the method comprising:
   a) providing the two-dimensional material and the support layer in a first state of strain; and
   b) applying the two-dimensional material and the support layer onto the target substrate whilst subjecting the two-dimensional material and the support layer to a tensile stressing force which produces a second state of strain in the two-dimensional material, and the support layer;
   wherein:
   the second state of strain is a strain of from 0.05 to 1.5%; and
   the strain of the two-dimensional material in the second state of strain is higher than the strain of the two-dimensional material in the first state of strain.

2. The method according to claim 1, wherein the second state of strain is at least partially maintained in the two-dimensional material on the target substrate after the applying the two-dimensional material onto the target substrate.

3. The method according to claim 1, wherein the providing the two-dimensional material in the first state of strain comprises removing the two-dimensional material from an originator substrate.

4. The method according to claim 1, wherein the providing the two-dimensional material in the first state of strain comprises adhering the two-dimensional material to a transfer substrate.

5. The method according to claim 4, wherein at least a part of the two-dimensional material is freely suspended between a first part and a second part of the transfer substrate.

6. The method according to claim 1, wherein the target substrate comprises a cavity and the applying the two-dimensional material onto the target substrate comprises at least partially suspending the two-dimensional material over the cavity.

7. The method according to claim 1, wherein the first state of strain is a strain of below 0.2%.

8. The method according to claim 1, wherein the support layer is a dielectric material.

9. The method according to claim 1, wherein the applying the two-dimensional material onto the target substrate comprises adhering at least a first part of the two-dimensional material to the target substrate and applying the tensile stressing force to a second part of the two-dimensional material to provide the second state of strain in the two-dimensional material between the first and second parts of the two-dimensional material.

10. The method according to claim 9, wherein the applying the two-dimensional material onto the target substrate comprises progressively applying the two-dimensional material to the target substrate between the first and second parts of the two-dimensional material.

11. The method according to claim 1, wherein the applying the two-dimensional material onto the target substrate comprises applying the two-dimensional material from a roll onto the target substrate.

12. A method of fabricating a device, the method comprising:
   (i) providing a target substrate having at least one cavity, and
   (ii) applying a two-dimensional material on to the target substrate according to the method of claim 1.

13. A device fabricated according to the method of claim 12, the device comprising:
   a substrate having at least one cavity; and
   a two-dimensional material mounted on the substrate;
   wherein the two-dimensional material spans at least a part of the cavity; and
   wherein the two-dimensional material has a strain of from 0.05 to 1.5%.

* * * * *